United States Patent
Wilson et al.

(10) Patent No.: US 7,417,459 B2
(45) Date of Patent: Aug. 26, 2008

(54) ON-DIE OFFSET REFERENCE CIRCUIT BLOCK

(75) Inventors: Timothy M. Wilson, Aloha, OR (US);
Songmin Kim, Beaverton, OR (US);
Gregory F. Taylor, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 384 days.

(21) Appl. No.: 11/100,865

(22) Filed: Apr. 6, 2005

(65) Prior Publication Data

US 2006/0239051 A1 Oct. 26, 2006

(51) Int. Cl.
*H03K 19/0175* (2006.01)
(52) U.S. Cl. .................... 326/82; 326/86; 327/109; 327/540
(58) Field of Classification Search .............. 326/30, 326/82–83, 86–87; 327/108–109, 333, 538, 327/540–541, 543; 323/281, 313
See application file for complete search history.

(56) References Cited

U.S. PATENT DOCUMENTS

| | | | | |
|---|---|---|---|---|
| 5,053,692 A * | 10/1991 | Craddock | .................. | 323/365 |
| 5,251,017 A * | 10/1993 | Riviere | ........................ | 348/674 |
| 5,361,042 A * | 11/1994 | Gist | ........................... | 330/261 |
| 5,903,504 A * | 5/1999 | Chevallier et al. | ........... | 365/207 |
| 5,958,021 A * | 9/1999 | Tsuchiyama et al. | ......... | 710/12 |
| 6,026,104 A * | 2/2000 | Itou | ........................ | 372/38.01 |
| 6,072,334 A * | 6/2000 | Chang | .......................... | 326/82 |
| 6,163,183 A * | 12/2000 | Azimi et al. | ................ | 327/142 |
| 6,282,146 B1 * | 8/2001 | Guo et al. | ............. | 365/230.06 |
| 6,321,282 B1 * | 11/2001 | Horowitz et al. | ........... | 710/104 |
| 6,407,638 B1 * | 6/2002 | Migliavacca | ................ | 330/289 |
| 6,477,606 B1 * | 11/2002 | Kawamura et al. | ......... | 710/305 |
| 6,566,911 B1 * | 5/2003 | Moyer | .......................... | 326/83 |
| 6,584,380 B1 * | 6/2003 | Nemoto | ...................... | 700/299 |
| 6,650,173 B1 * | 11/2003 | Khouri et al. | ................ | 327/538 |
| 6,785,828 B2 | 8/2004 | Yuan | | |
| 6,862,642 B1 * | 3/2005 | Packer et al. | ................ | 710/300 |
| 2005/0066077 A1 * | 3/2005 | Shibata et al. | ................ | 710/33 |
| 2006/0066351 A1 * | 3/2006 | Lau | .............................. | 326/86 |

* cited by examiner

*Primary Examiner*—Rexford Barnie
*Assistant Examiner*—Jason M Crawford
(74) *Attorney, Agent, or Firm*—Schwabe, Williamson & Wyatt, P.C.

(57) ABSTRACT

A method and apparatus for an integrated circuit having a offset reference circuit block to receive an external voltage reference and output an offset reference voltage are described herein.

14 Claims, 4 Drawing Sheets

ON-DIE OFFSET REFERENCE CIRCUIT BLOCK

TECHNICAL FIELD

Embodiments of the invention relate generally to the field of integrated circuits, and more particularly to an integrated circuit having an offset reference circuit block.

BACKGROUND

Electrical input/output (I/O) standards define electrical properties such as operating voltage, driving current, level-switching behavior, etc., for communicative exchanges between components of a system. One class of I/O standards, commonly referred to as voltage-referenced, involves reference to a supplied voltage to determine the high/low state of signals. A voltage-referenced standard may provide for higher data transfer speeds with smaller voltage swings.

In typical operation, a platform implementing a voltage-referenced standard may use a reference voltage generator disposed on a motherboard to supply a reference voltage to various system components, such as, a central processing unit and a chipset. The reference voltage may be provided directly to the I/O buffer of the components to be used for interpreting/generating incoming/outgoing data signals. Unfortunately, dependence upon the reference voltage off of the motherboard as the component reference voltage may limit the effectiveness of the platform. A component may be forced to adapt to a reference voltage common to the platform without regard for the margins that are most suitable to the particular component. Still other components may be entirely incompatible with the platform reference voltage.

BRIEF DESCRIPTION OF THE DRAWINGS

Embodiments of the invention are illustrated by way of example and not by way of limitation in the figures of the accompanying drawings, in which like references indicate similar elements and in which.

DETAILED DESCRIPTION

Illustrative embodiments of the present invention include an integrated circuit having an offset reference circuit block to receive an external reference voltage and output an offset reference voltage.

Various aspects of the illustrative embodiments will be described using terms commonly employed by those skilled in the art to convey the substance of their work to others skilled in the art. However, it will be apparent to those skilled in the art that alternate embodiments may be practiced with only some of the described aspects. For purposes of explanation, specific materials and configurations are set forth in order to provide a thorough understanding of the illustrative embodiments. However, it will be apparent to one skilled in the art that alternate embodiments may be practiced without the specific details. In other instances, well-known features are omitted or simplified in order not to obscure the illustrative embodiments.

Further, various operations will be described as multiple discrete operations, in turn, in a manner that is most helpful in understanding the present invention; however, the order of description should not be construed as to imply that these operations are necessarily order dependent. In particular, these operations need not be performed in the order of presentation.

The phrase "in one embodiment" is used repeatedly. The phrase generally does not refer to the same embodiment; however, it may. The terms "comprising," "having," and "including" are synonymous, unless the context dictates otherwise.

Figure 1:
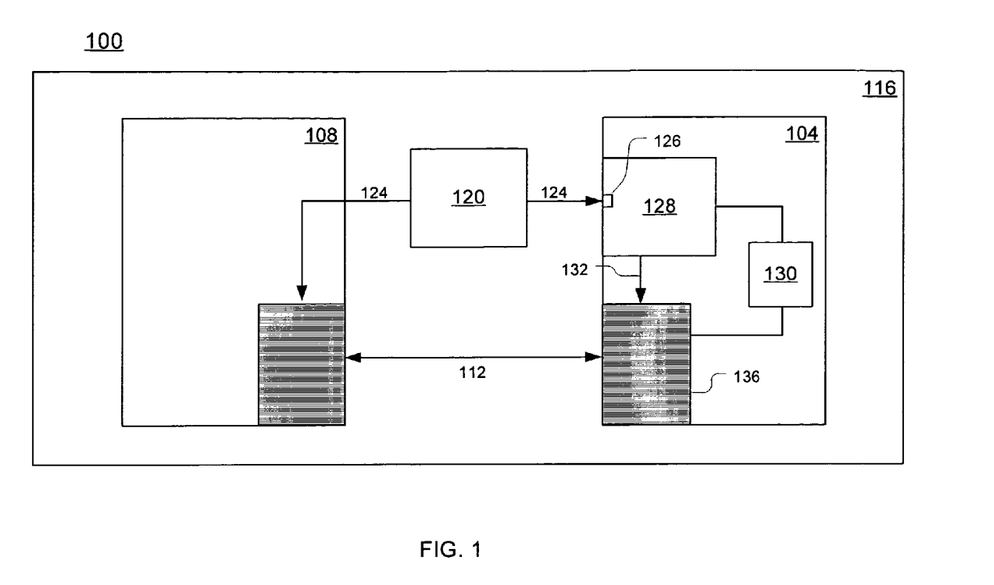
FIG. 1 illustrates a system having a processing node with an offset circuit control block in accordance with an embodiment of the present invention.

FIG. 1 illustrates a system 100 having a processing node 104 communicatively coupled to another processing node 108 through a bus 112 in accordance with an embodiment of the present invention. In one embodiment, both of the processing nodes 104 and 108 may be mounted onto a motherboard 116. A reference generator circuit 120, which in various embodiments may be disposed on the motherboard 116 as shown, or it may be a part of the processing node 104 and/or 108, may output a reference (REF) voltage 124 to the processing nodes 104 and/or 108. Communicative signals sent between the processing nodes 104 and 108 over the bus 112 may be interpreted based at least in part on the REF voltage 124. In one embodiment, the system 100 may employ voltage-referenced logic for processing electrical communications between the processing nodes 104 and 108 over the bus 112, such as, but not limited to, Gunning transceiver logic (GTL).

In one embodiment, the processing node 104 may include an integrated circuit, which is typically formed in a rectangular piece of semiconductor material called a chip or a die. Examples of the semiconductor material include, but are not limited to silicon, germanium, and gallium arsenide.

The integrated circuit may include an offset reference circuit block 128 to receive the REF voltage 124 from an external voltage source, e.g., the reference generator circuit 120, at a die pad 126. In one embodiment, a controller 130 may be coupled to, and cooperate with, the offset reference circuit block 128 to effectuate the output of a biased reference ($REF_{bias}$) voltage 132 based at least in part on the REF voltage 124. In one embodiment, the output of $REF_{bias}$ voltage 132 may be effectuated by offsetting the REF voltage 124 by a voltage offset, which may be a positive offset, a negative offset, or a null offset. In one embodiment, the offset reference circuit block 128 may adjust the voltage offset to adapt to a particular operating environment.

The integrated circuit may also include an input/output (I/O) buffer 136 coupled to the offset reference circuit block 128 in a manner to receive the $REF_{bias}$ voltage 132. The I/O buffer 136 may also be coupled to the bus 112 and may operate to buffer input data from an external data source, such as the processing node 108, and/or to buffer output data from the processing node 104 to an external data sink, e.g., processing node 108. The I/O buffer 136 may have circuitry to terminate transmissions over the bus 112. The I/O buffer 136 may buffer input and/or output data based at least in part on the $REF_{bias}$ voltage 132. In particular, the $REF_{bias}$ voltage 132 may be used as a reference for determining high/low states of signals.

The offset reference circuit block 128 may allow for the processing node 104 to operate with a $REF_{bias}$ 132 that is based at least in part on the REF voltage 124, while other components, such as the processing node 108, operate with the REF voltage 124. In one embodiment, this may facilitate the tuning of the bus 112 for the processing nodes 104 and 108 independently while using a common reference generator circuit 120, disposed on the motherboard 116 in this embodiment. Modifications to the REF voltage 124, through generation of the $REF_{bias}$ voltage 132, may be done for the processing node 104 without impacting other components of the system 100. And because these modifications are done through the offsetting of the REF voltage 124 they may facilitate individual component flexibility while maintaining platform cohesion. In one embodiment, this may allow for the processing node 104 to account for systemic, but unintentional, offsets from, e.g., the I/O buffer 136.

In one embodiment the processing node 104 may be a processor, such as a central processing unit (CPU), and the processing node 108 may be a chipset adapted to couple the processor to a number of other components such as, but not limited to, memory, a graphics processor, a mass storage device, and other I/O modules. Examples of the memory include but are not limited to static random access memory (SRAM) and dynamic random access memory (DRAM). Examples of the mass storage device include but are not limited to a hard disk drive, a compact disk drive (CD), a digital versatile disk drive (DVD), and so forth. Examples of other input/output modules include but are not limited to a network interface, a keyboard, cursor control devices, a display, and so forth.

In various embodiments, the system 100 may be a wireless mobile phone, a personal computing device, a tablet computing device, a notebook computing device, a desktop computing device, a set-top box, an audio/video controller, a digital versatile disk (DVD) player, and a server.

Figure 2:
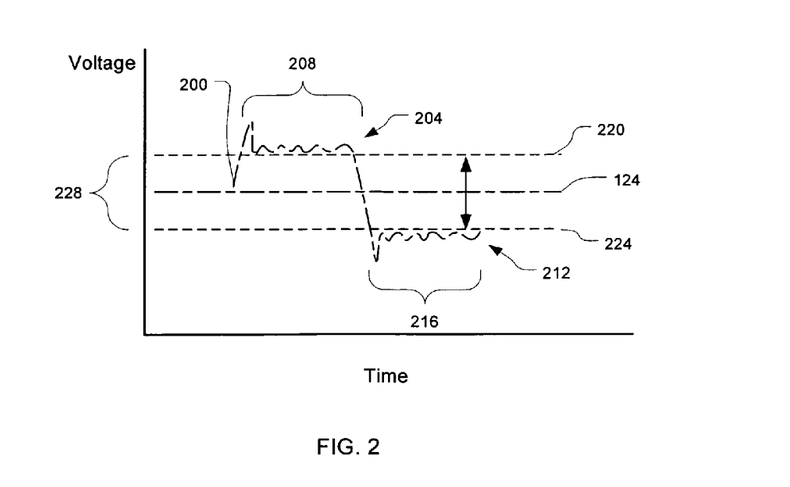
FIG. 2 illustrates a waveform of a test signal for use in margining of a reference voltage in accordance with an embodiment of the present invention.

FIG. 2 illustrates a waveform of a test signal 200 that may be used to margin the $REF_{bias}$ voltage 132, in accordance with an embodiment of the present invention. The test signal 200 may be in a high state 204 for a first period 208 and a low state 212 for a second period 216. An upper-pass limit 220 may be set at a point below the noise of the test signal 200 while in the high state 204. Likewise, a lower-pass limit 224 may be set at a point above the noise of the test signal 200 while in the low state 212. The distance between the upper-pass limit 220 and the lower-pass limit 224 may be referred to as the margin 228.

Figure 3:
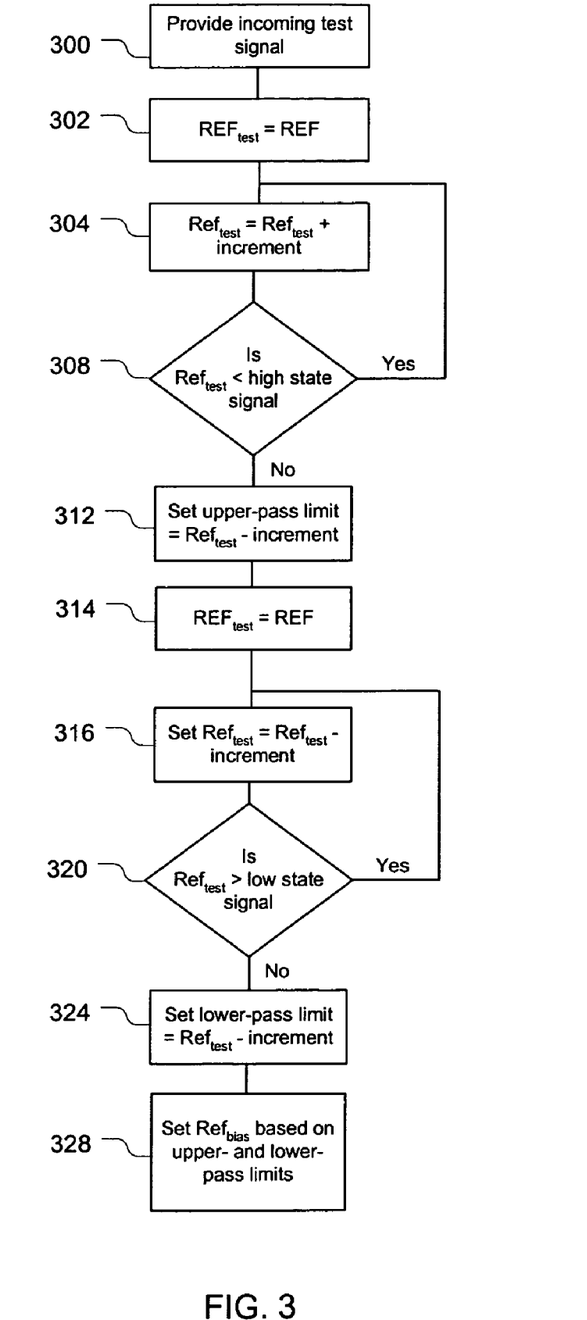
FIG. 3 illustrates a methodology for margining the reference voltage in accordance with an embodiment of the present invention.

FIG. 3 illustrates a methodology for margining the $REF_{bias}$ voltage 132 using the test signal 200, in accordance with an embodiment of the present invention. In one embodiment the test signal 200 may be provided to the I/O buffer 136 from the processing node 108 (300). Reference labels corresponding to phases depicted in FIG. 3 may be denoted in parentheses.

The controller 130 may control the offset reference circuit block 128 in such a manner that a test ($REF_{test}$) voltage "floats" up to establish the upper-pass limit 220 during the first period 208. The $REF_{test}$ voltage may be a temporary version of the $REF_{bias}$ voltage 132 output by the offset reference circuit block 128 for use in the margining procedure. Initially the controller 130 may set the $REF_{test}$ voltage equal to the $REF_{bias}$ voltage 132 (302) and increment the $REF_{test}$ voltage (304). The increment used may be any positive value and may be determined in a number of ways depending on the needs and objectives of a particular embodiment. The $REF_{test}$ voltage may then be compared to the high state signal 204 (308). If the $REF_{test}$ voltage is less than the high state signal 204, the $REF_{test}$ voltage may be incremented again (304). If the high state signal 204 fails, e.g., the $REF_{test}$ voltage is equal to or greater than the high state signal 204, then the upper-pass limit may be backed off of the $REF_{test}$ voltage by a certain amount, e.g., by the increment (312). In various embodiments, the upper-pass limit 220 may be backed off in amounts other than the increment as well.

In a similar manner, the controller 130 may control the offset reference circuit block 128 to cause $REF_{test}$ to float down to establish the lower-pass limit 224 during the second period 216. The controller 130 may do this by setting the $REF_{test}$ voltage equal to the REF voltage 124 (314) and decrementing the $REF_{test}$ voltage (316). When the $REF_{test}$ voltage becomes less than or equal to the low state signal (320) the lower-pass limit may be backed off of the $REF_{test}$ voltage by a certain amount, e.g., the increment value (324).

In various embodiments, the upper-pass limit 220 and the lower-pass limit 224 may be backed off of the value of the $REF_{test}$ voltage resulting in signal failures by different or the same amounts.

As shown and discussed in FIG. 2 and FIG. 3, the margining of the $REF_{bias}$ voltage 132 is done while the test signal 200 has one high state 204 and one low state 212. However, in various embodiments, the $REF_{test}$ voltage may be a set value that is held constant over a period while the test signal 200 transitions through multiple high and low signals. The known value of the test signal 200 may then be compared to the interpreted value given by the $REF_{test}$ voltage to assess the value of the $REF_{test}$ voltage. The $REF_{test}$ voltage could then be incrementally floated up and/or down to stress the configuration.

In various embodiments, the upper-pass limit 220 may be set before or after the lower-pass limit 224.

With the upper-pass limit 220 and the lower-pass limit 224 established, the $REF_{bias}$ voltage 132 may be set (328). In one embodiment the $REF_{bias}$ voltage 132 may be set such that it is equidistant from the upper-pass limit 220 and the lower-pass limit 224 as represented by the following equation:

$$REF_{bias} = \frac{1}{2}(\text{Upperpasslimit} + \text{Lowerpasslimit}), \qquad \text{Eq. 1.}$$

In other embodiments, other margining techniques may be used to establish the $REF_{bias}$ voltage 132.

In one embodiment, the floating of the $REF_{test}$ voltage during the margining may be done from the motherboard 116, for example, by the reference generator circuit 120. In this embodiment the offset reference circuit block 128 may simply pass through the voltage during the margining. In another embodiment, the controller 130 may cause the offset reference circuit block 128 to float the $REF_{test}$ voltage by incrementally offsetting the REF voltage 124.

In one embodiment the margining of the $REF_{bias}$ voltage 132 may be done during a testing phase initiated upon the assembly of the system 100. In another embodiment, the margining may be done periodically throughout the use of the system, for example, during a power-on self test (POST) of the system 100.

Figure 4:
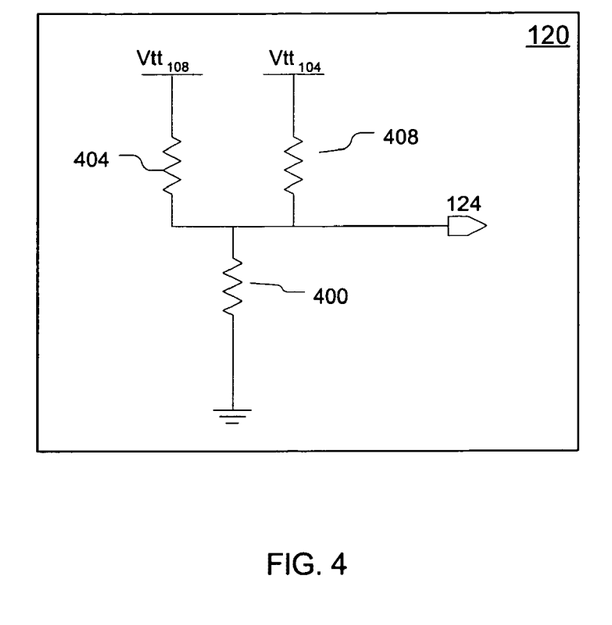
FIG. 4 illustrates a reference voltage generator in accordance with an embodiment of the present invention.

FIG. 4 illustrates the reference generator circuit 120 in accordance with an embodiment of the present invention. In this embodiment, a first segment may include a power supply of the processing node 108, $Vtt_{108}$, coupled to a resistive device 404. A second segment may include a power supply of the processing node 104, $Vtt_{104}$, coupled to a resistive device 408. A third segment may include a resistive device 400 and go to a lower-voltage power supply, e.g., ground. The REF voltage 124 may be taken at the intersection of these three segments. In such a manner, the REF voltage 124 may be generated in relation to both $Vtt_{104}$ and $Vtt_{108}$.

The circuit configuration of the reference generator circuit 120 shown in FIG. 4 may be referred to as a resistor divider configuration. In various embodiments, circuit configurations other than the one shown and discussed may be used to generate the REF voltage 124.

Figure 5:
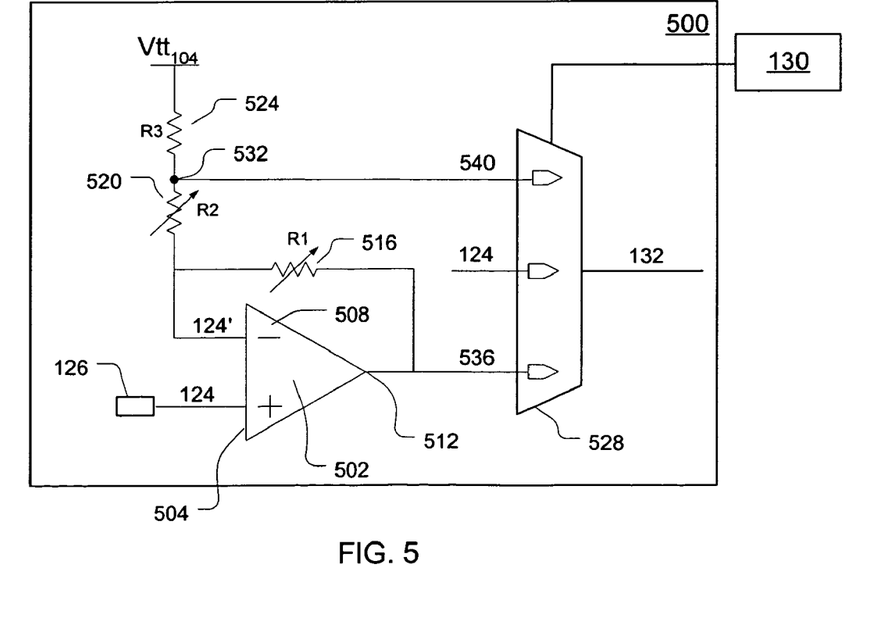
FIG. 5 illustrates an offset circuit control block in accordance with an embodiment of the present invention.

FIG. 5 illustrates an offset reference circuit block 500 in accordance with an embodiment of the present invention. The offset reference circuit block 500 may be similar to, and substantially interchangeable with, the offset reference circuit block 128 and accordingly will therefore be described with reference to elements similar to those discussed above.

In this embodiment the offset reference circuit block 500 may include an operational amplifier (OpAmp) 502 having a non-inverting input terminal 504 coupled to the die pad 126 to receive the REF voltage 124. An inverting input terminal 508 of the OpAmp 502 may be coupled to the OpAmp 502 output terminal 512 through a feedback loop having a resistive device (R1) 516 that may be capable of providing a variable resistance. A voltage 124' taken at the inverting input terminal 508 may follow the REF voltage 124 taken at the non-inverting input terminal 504. For simplification of the following equations, the voltage 124' may be assumed to be approximately equal to REF voltage 124. In various implementations slight variations between the voltages may occur. The inverting input terminal 508 may also be coupled to a segment having a resistive device (R2) 520, which also may be capable of providing a variable resistance, in series with a resistive device (R3) 524 going to $Vtt_{104}$.

In various embodiments the resistance of R1 516 and R2 520 may be controlled by the controller 130 or some other control circuitry. In various embodiments each of the resistive devices R1 516 and R2 520 may represent multiple resistive devices in parallel and/or in series with analog switches (e.g., pass gates) to add or subtract them from the circuit. In one embodiment the analog switches may be coupled to, and controlled by, the controller 130. In one embodiment R1 516 and R2 520 may include gate block nwells (gbnwells) formed in the die of the processing node 104.

A multiplexer 528 may be coupled to the output terminal 512, to the die pad 126, and to a junction 532 in order to receive a $REF_{low}$ voltage 536, the REF voltage 124 and a $REF_{high}$ voltage 540, respectively. The $REF_{low}$ voltage 536, manifested at the output terminal 512 may represent the REF voltage 124 negatively offset by a voltage offset. The transfer function for the $REF_{low}$ voltage 536 of the offset reference circuit block 500 of this embodiment may be stated by the following equation:

$$REF_{low} = REF - \left[\left(\frac{R1}{R3+R2}\right)(Vtt_{104} - REF)\right], \quad \text{Eq. 2.}$$

As can be seen by Eq. 2, the voltage offset may be varied by adjusting the resistive values of R1 516 and/or R2 520. In various embodiments, the negative voltage offset for the $REF_{low}$ voltage 536 may be up to, e.g., approximately 10% of the power supply $Vtt_{104}$; however, other embodiments may have greater voltage offsets.

In an embodiment the $REF_{high}$ voltage 540, manifested at the junction 532, may represent the REF voltage 124 positively offset by an offset voltage, which may, or may not, be the same as the offset voltage used for establishing the $REF_{low}$ voltage 536. The transfer function for the $REF_{high}$ voltage 540 of the offset reference circuit block 500 of this embodiment may be stated by the following equation:

$$REF_{high} = REF + \left[\left(\frac{R2}{R3+R2}\right)(Vtt_{104} - REF)\right], \quad \text{Eq. 3.}$$

As shown in Eq. 3, the voltage offset may be varied by adjusting the resistive value of R2 520. In one embodiment, the positive voltage offset for the $REF_{high}$ voltage 540 may be similar in value to the negative voltage offset for the $REF_{low}$ voltage 536, e.g., up to approximately 10% of the power supply $Vtt_{104}$. In this embodiment the voltage-offset range may be approximately +/−10% of the power supply $Vtt_{104}$. In one embodiment R1 516 may be set equal to R2 520 to facilitate having uniform voltage offsets for both the $REF_{high}$ voltage 540 and the $REF_{low}$ voltage 536. In other embodiments, the positive and negative voltage offsets may be non-uniform.

The controller 130 may be coupled to the multiplexer 528 and may control the multiplexer 528 to selectively output one of the three possible voltage levels 536, 124, or 540, as the $REF_{bias}$ voltage 132. In an embodiment the multiplexer 528 may be, for example, a complementary metal-oxide semiconductor (CMOS) analog multiplexer.

Figure 6:
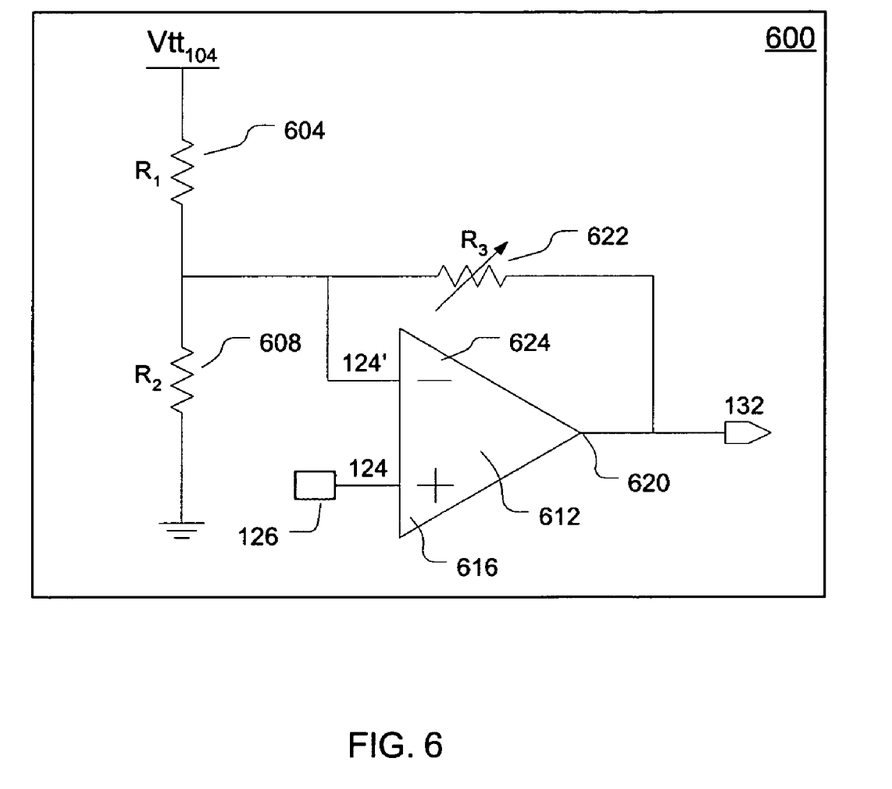
FIG. 6 illustrates an offset circuit control block in accordance with another embodiment of the present invention.

FIG. 6 illustrates an offset reference circuit block 600 in accordance with another embodiment of the present invention. The offset reference circuit block 600 may be similar to, and substantially interchangeable with, the offset reference circuit block 128 and accordingly will therefore be described with reference to elements similar to those discussed above.

In this embodiment, the offset reference circuit block 600 may include a first segment to couple $Vtt_{104}$ to ground through resistive devices (R1) 604 and (R2) 608. An OpAmp 612 may have a non-inverting input terminal 616 coupled to the die pad 126 to receive the REF voltage 124. A feedback loop may couple an output terminal 620 of the OpAmp 612 to an inverting input terminal 624 through a resistive device (R3) 622 capable of providing a variable resistance. The voltage 124' taken at the inverting input terminal 624 may follow the REF voltage 124 taken at the non-inverting input terminal 616. In one embodiment the $REF_{bias}$ voltage 132 may be taken at the output terminal 620 and may be adjusted by varying the resistance through R3 622. In another embodiment, the output terminal 620 may be coupled to a multiplexer (not shown) along with the die pad 126. In this embodiment, the $REF_{bias}$ voltage 132 may be output by the multiplexer selectively outputting the voltage taken at the die pad 126 or the output terminal 620, similar to embodiment described and discussed with reference to FIG. 5.

Some of the embodiments discussed above include an offset reference circuit block having semiconductor devices such as resistive devices, an OpAmp, and a multiplexer. These semiconductor devices are illustrated schematically to facilitate the discussion of the circuit characteristics. When implemented or manufactured these may comprise multiple devices, depending, for example, upon the application or the particular integrated circuit chip. For example, as it is well known, some form of digital and/or analog circuit compensation may be included to address the potential variation in circuit parameters known to occur as a result of the fabrication process. Therefore, the simplified circuit diagrams are provided primarily for purposes of illustration and when actually implementing a particular offset reference circuit control block, more complex circuitry may be employed to provide operations such as those described herein.

Also, certain logical functions schematically represented by a logic component should not be limited to that specific component. Additionally, a particular embodiment may vary the placement of the circuit components from the placements depicted in the figures, while still being within the teachings of embodiments of the present invention. For example, referring to FIG. 6, in an embodiment having the REF voltage 124 equal to, or less than, half of the $Vtt_{104}$ supply voltage, R1 604 may be placed in series between R2 608 and the ground.

Accordingly, methods and apparatuses for an on-die offset reference control circuit block have been described. Although the present invention has been described in terms of the above-illustrated embodiments, it will be appreciated by those of ordinary skill in the art that a wide variety of alternate and/or equivalent implementations calculated to achieve the same purposes may be substituted for the specific embodiments shown and described without departing from the scope of the present invention. Those with skill in the art will readily appreciate that the present invention may be implemented in a very wide variety of embodiments. This description is intended to be regarded as illustrative instead of restrictive on embodiments of the present invention.

What is claimed is:

1. An integrated circuit comprising:
   an offset reference circuit block, disposed in a die, adapted to receive a first reference voltage from an external voltage source, and to output a second reference voltage based at least in part on the first reference voltage, the offset reference circuit blocking including:
   an operational amplifier having
      a first input terminal coupled to a die pad to receive the first reference voltage,
      a second input terminal,
      a first output terminal,
      a feedback loop adapted to couple the first output terminal to the second input terminal, the first output terminal adapted to manifest a third reference voltage that is negatively offset from the first reference voltage, the feedback loop including a first resistive device adapted to provide a first resistance that is variable,
   a first segment adapted to couple a first voltage source to the second input terminal of the operational amplifier, the first segment having
      a second resistive device adapted to provided a second resistance in series with a third resistive device adapted to provide a third resistance that is variable,
   a second output terminal disposed between the second resistive device and the third resistive device and adapted to manifest a forth reference voltage that is positively offset from the first reference voltage, and
   a multiplexer coupled to the die pad, the first output terminal and the second output terminal and adapted to generate the second reference voltage by selectively outputting the first reference voltage, the third reference voltage, or the fourth reference voltage manifested on the die pad, the first output terminal, and the second output terminal, respectively; and
   an input/output buffer, disposed in the die, and coupled to the offset reference circuit block, the input/output buffer adapted to receive the second reference voltage and operate to buffer input data from an external data source or buffer output data for an external data sink, based at least in part on the second reference voltage, each of the external data source and the external data sink being adapted to receive and operate based on the first reference voltage.

2. The integrated circuit of claim 1, wherein the second reference voltage is offset from the first reference voltage by a voltage offset that is within a voltage-offset range.

3. The integrated circuit of claim 2, wherein the offset reference circuit block is further adapted to adjust the voltage offset.

4. The integrated circuit of claim 2, wherein the voltage-offset range is approximately +/−10% of a power supply of the die.

5. The integrated circuit of claim 2, wherein the voltage offset comprises a positive offset, a negative offset, or a null offset.

6. The integrated circuit of claim 1, further comprising:
   a controller coupled to the multiplexer and adapted to control the multiplexer in a manner to facilitate the selective output of the first reference voltage, the third reference voltage, or the fourth reference voltage.

7. A method comprising:
   receiving a first reference signal with an offset reference circuit block of an integrated circuit from an external voltage source, the first reference signal being also received by an external data source or an external data sink that operates based on the first reference signal;
   providing a second reference signal by a multiplexer, the providing the second reference signal including providing a voltage offset to the first reference signal with the offset reference circuit block, the providing the second reference signal being done by selectively outputting the first reference signal, a third reference signal, or a fourth reference signal, the third reference signal being negative offset from the first reference signal, the forth reference signal being a positive offset from the first reference signal, the providing a second reference signal being based at least in part on the first reference signal, to an input/output buffer of the integrated circuit; and
   operating the input/output buffer to buffer input data from an external data source or buffer output data for an external data sink based at least in part on the second reference signal.

8. The method of claim 7, wherein said providing of the second reference signal comprises:
   receiving a test signal by the input/output buffer from the external data source, the test signal having a high state during a first period and a low state during a second period;
   determining an upper-pass limit by incrementally increasing the second reference signal during the first period until the test signal becomes less than the second reference signal;
   determining a lower-pass limit by decrementally decreasing the second reference signal during the second period until the test signal becomes greater than the second reference signal; and
   providing the second reference signal based at least in part on the upper-pass limit and the lower-pass limit.

9. The method of claim 8, wherein said incrementally increasing of the second reference signal and said decrementally decreasing of the second reference signal is done by the offset reference control block.

10. The method of claim 8, wherein said providing of the second reference signal further comprises:
    providing the second reference signal approximately equidistant from the upper-pass limit and the lower-pass limit.

11. The method of claim 7, wherein said providing of the voltage offset further comprises providing the positive offset, the negative offset, or a null offset.

12. A system comprising:
a motherboard;
a reference generator disposed on the motherboard and adapted to generate a first reference voltage;
a die, disposed on the motherboard, having an integrated circuit coupled to the reference generator, the integrated circuit having
an offset reference circuit block adapted to receive the first reference voltage from the reference generator and to output a second reference voltage based at least in part on the first reference voltage, and
an input buffer coupled to the offset reference circuit block, the input/output adapted to receive the second reference voltage and operate to buffer input data from an external data source or buffer output data for an external data sink, based at least in part on the second reference voltage, each of the external data source and the external data sink being adapted to receive and operate based on the first reference voltage;
a multiplexer coupled to a die pad, a first output terminal of the offset reference circuit block, and a second output terminal of the offset reference circuit block, and adapted to generate the second reference voltage by selectively outputting the first reference voltage, a third reference voltage, or a fourth reference voltage manifested on the die pad, the first output terminal, and the second output terminal, respectively; and
a mass storage device coupled to the integrated circuit.

13. The system of claim 12, wherein the integrated circuit comprises a central processing unit, the external data sink comprises a chipset, and the system further comprises:
an input/output bus adapted to communicatively couple the central processing unit to the chipset.

14. The system of claim 13, wherein the system comprises a device selected from the group consisting of a tablet computing device, a notebook computing device, a desktop computing device, and a server.

* * * * *

UNITED STATES PATENT AND TRADEMARK OFFICE
CERTIFICATE OF CORRECTION

PATENT NO. : 7,417,459 B2
APPLICATION NO. : 11/100865
DATED : August 26, 2008
INVENTOR(S) : Wilson et al.

It is certified that error appears in the above-identified patent and that said Letters Patent is hereby corrected as shown below:

ABSTRACT
Lines 1-2, "...a offset..." should read --...an offset...--.

Column 7
Line 29, "...circuit blocking..." should read --...circuit block...--.
Line 45, "...to provided..." should read --...to provide...--.

Column 8
Lines 30-31, "...being negative offset..." should read --...being a negative offset...--.
Lines 31-32, "..., the forth reference signal..." should read --..., the fourth reference signal...--.
Line 37, "...an external data source..." should read --...the external data source...--.
Lines 37-38, "...an external data sink..." should read --...the external data sink...--.

Column 9
Line 12, "...an input buffer..." should read --...an input/output buffer...--.
Line 13, "...input/output adapted..." should read --...input/output buffer adapted...--.

Signed and Sealed this

Twenty-third Day of March, 2010

David J. Kappos
*Director of the United States Patent and Trademark Office*